(12) United States Patent
Kwak

(10) Patent No.: US 9,720,595 B2
(45) Date of Patent: Aug. 1, 2017

(54) NONVOLATILE MEMORY DEVICE AND OPERATION METHOD OF STORAGE DEVICE INCLUDING THE NONVOLATILE MEMORY DEVICE

(71) Applicant: Donghun Kwak, Hwaseong-si (KR)

(72) Inventor: Donghun Kwak, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 154 days.

(21) Appl. No.: 14/606,252

(22) Filed: Jan. 27, 2015

(65) Prior Publication Data

US 2015/0331627 A1 Nov. 19, 2015

(30) Foreign Application Priority Data

May 14, 2014 (KR) .................. 10-2014-0057861

(51) Int. Cl.
| | |
|---|---|
| *G06F 3/06* | (2006.01) |
| *G11C 11/56* | (2006.01) |
| *G11C 16/34* | (2006.01) |
| *G11C 16/16* | (2006.01) |
| *G11C 16/20* | (2006.01) |
| *G06F 12/00* | (2006.01) |

(52) U.S. Cl.
CPC ............... *G06F 3/06* (2013.01); *G06F 3/065* (2013.01); *G06F 3/0619* (2013.01); *G06F 3/0655* (2013.01); *G06F 3/0688* (2013.01); *G06F 12/00* (2013.01); *G11C 11/5628* (2013.01); *G11C 11/5635* (2013.01); *G11C 16/16* (2013.01); *G11C 16/20* (2013.01); *G11C 16/3418* (2013.01); *G11C 16/3427* (2013.01); *G11C 2211/5648* (2013.01)

(58) Field of Classification Search
CPC .......... G06F 3/06; G06F 3/065; G06F 3/0688; G06F 3/0655; G06F 3/0619; G06F 12/00; G06F 2211/5648; G11C 11/5628; G11C 11/5635; G11C 16/3427; G11C 16/3418; G11C 16/16; G11C 16/20
See application file for complete search history.

(56) References Cited

U.S. PATENT DOCUMENTS

| | | | |
|---|---|---|---|
| 8,130,550 B1 | 3/2012 | Confalonieri | |
| 8,537,615 B2 | 9/2013 | Maeda | |
| 8,559,221 B2 | 10/2013 | Kito et al. | |
| 8,559,224 B2 | 10/2013 | Han et al. | |
| 2008/0273405 A1* | 11/2008 | Byun ................. | G11C 11/5628 365/200 |

(Continued)

FOREIGN PATENT DOCUMENTS

JP 2013-200913 A 10/2013

*Primary Examiner* — Aracelis Ruiz
(74) *Attorney, Agent, or Firm* — Volentine & Whitt, PLLC

(57) ABSTRACT

A method of operating a storage device having a nonvolatile memory including at least one memory block having a plurality of sub-blocks includes reading backup data of backup memory cells having a highest program state among a plurality of memory cells connected to at least one word line of a sub-block which is not erase-requested adjacent to an erase-requested sub-block among the sub-blocks. The method includes storing the backup data, erasing the erase-requested sub-block, and reprogramming the backup memory cells having the highest program state on the basis of the backup data.

19 Claims, 17 Drawing Sheets

(56) References Cited

U.S. PATENT DOCUMENTS

| | | |
|---|---|---|
| 2012/0170365 A1 | 7/2012 | Kang et al. |
| 2013/0007353 A1* | 1/2013 | Shim .................. G11C 16/10 711/103 |
| 2013/0083599 A1 | 4/2013 | Nam et al. |
| 2013/0100737 A1 | 4/2013 | Kwak |
| 2013/0229872 A1 | 9/2013 | Kim |
| 2013/0322174 A1 | 12/2013 | Li et al. |

* cited by examiner

FIG. 5

| | | |
|---|---|---|
| SSL1 | | Float |
| SSL2 | | |
| SSL3 | | |
| 2nd Sub-block | WL4-6 | Vwe |
| 1st Sub-block | WL1-3 | Float |
| GSL | | Float |
| Substrate | | Vers |

FIG. 15

| Parameter \ Elapse Time | T≤T1 | T1<T≤T2 | T2<T |
|---|---|---|---|
| Increment of VPGM | VI1 | VI2 (>VI1) | VI4 (VI2) |
| Start Voltage of VPGM | VS1 | VS2 (<VS1) | VS3 (<VS2) |
| Program Verfication Voltage | VFY1 | VFY2 (<VFY1) | VFY3 (<VFY2) |
| Percharge Voltage for BL | VPRE1 | VPRE2 (<VPRE1) | VPRE3 (<VPRE2) |

NONVOLATILE MEMORY DEVICE AND OPERATION METHOD OF STORAGE DEVICE INCLUDING THE NONVOLATILE MEMORY DEVICE

CROSS-REFERENCE TO RELATED APPLICATIONS

This U.S. non-provisional patent application claims priority under 35 U.S.C. §119 of Korean Patent Application No. 10-2014-0057861, filed on May 14, 2014, the entire contents of which are hereby incorporated by reference.

BACKGROUND OF THE INVENTION

The inventive concept relates to a semiconductor memory, and more particularly, to a nonvolatile memory device having a three-dimensional array structure and an operation method of a storage device including the nonvolatile memory device.

A semiconductor memory device is a memory device which is embodied using semiconductor such as silicon Si, germanium Ge, gallium arsenide GaAs, indium phosphide InP, etc. A semiconductor memory device may be classified into a volatile memory device and a nonvolatile memory device. A volatile memory device loses its stored data when its power supply is interrupted. A nonvolatile memory device retains its stored data even when its power supply is interrupted.

An operation of a nonvolatile memory device may include a program operation, an erase operation and a read operation. An erase operation of a nonvolatile memory device is performed by a block unit. A recent nonvolatile memory device can erase only an erase-requested sub-block among a plurality of sub-blocks included in a block.

SUMMARY

Embodiments of the inventive concept provide an operation method of a storage device having a nonvolatile memory including at least one memory block having a plurality of sub-blocks. The operation method may include: reading backup data of backup memory cells having the highest program state among a plurality of memory cells connected to at least one word line of a sub-block which is not erase-requested adjacent to an erase-requested sub-block among the sub-blocks; storing the backup data; erasing the erase-requested sub-block; and reprogramming the backup memory cells having the highest program state on the basis of the backup data.

Embodiments of the inventive concept also provide an operation method of a storage device having a nonvolatile memory including at least one memory block having a plurality of sub-blocks. The operation method may include: reading data of a plurality of memory cells connected to at least one word line of a sub-block which is not erase-requested adjacent to an erase-requested sub-block among the sub-blocks; performing an error correction operation on the read data; storing the error-corrected data; erasing the erase-requested sub-block; and reprogramming data having the highest program state among the stored data.

Embodiments of the inventive concept also provide a nonvolatile memory device. The nonvolatile memory device may include a memory cell array comprising at least one memory block having a plurality of sub-blocks and a plurality of memory cells connected to at least one backup word line among a plurality of word lines of a sub-block which is not erase-requested adjacent to an erase-requested sub-block among the sub-blocks. A page buffer circuit is connected to the memory cell array and stores backup data of backup memory cells among the memory cells connected to the backup word line. Control logic ensures that the backup memory cells are reprogrammed after an erase of the erase-requested sub-block is performed. The backup memory cells have the highest program state among the memory cells and after an erase of the erase-requested sub-block is performed, the control logic reprograms the backed-up data in the backup memory cells.

BRIEF DESCRIPTION OF THE FIGURES

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

FIG. 5 is a table illustrating voltage conditions being applied to a memory block illustrated in FIG. 4 in an erase operation.

FIG. 15 is a table illustrating a voltage condition being applied to a memory block in a program operation in accordance with an embodiment of the inventive concept.

DETAILED DESCRIPTION OF PREFERRED EMBODIMENTS

Figure 1:
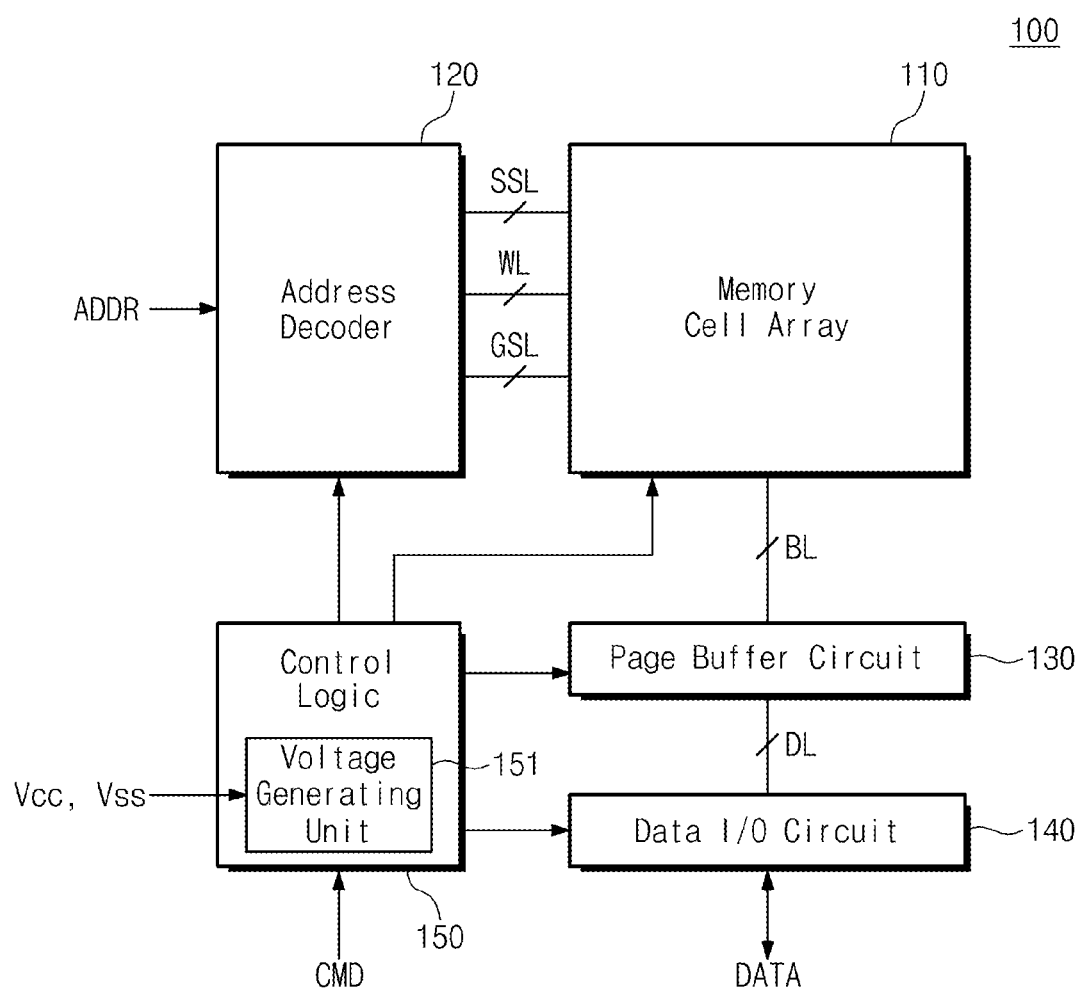
FIG. 1 is a block diagram illustrating a nonvolatile memory device in accordance with an embodiment of the inventive concept.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

FIG. 1 is a block diagram illustrating a nonvolatile memory device in accordance with an embodiment of the inventive concept. Referring to FIG. 1, a nonvolatile memory device 100 includes a memory cell array 110, an address decoder 120, a page buffer circuit 130, a data input/output circuit 140, and control logic 150. The memory cell array 110 is connected to the address decoder 120 through word lines WL and selection lines. For example, the selection lines may include string select lines SSL and ground select lines GSL. The memory cell array 110 is connected to the page buffer circuit 130 through bit lines BL.

The memory cell array 110 includes a plurality of memory blocks. Each of the memory blocks includes a plurality of pages and each of the pages includes a plurality of memory cells. One bit or more bits can be stored in each memory cell. The memory cell array 110 may include a plurality of memory blocks having a three-dimensional structure stacked along a direction across a substrate.

The address decoder 120 is connected to the memory cell array 110 through word lines WL, string select lines SSL, and ground select lines GSL. The address decoder 120 can operate according to a control of the control logic 150. The address decoder 120 receives an address ADDR, for example, from an external device. The address decoder 120 is configured to decode the received address ADDR. The address decoder 120 drives word lines WL on the basis of the decoded address. The address decoder 120 drives string select lines SSL and ground select lines GSL.

The address decoder 120 receives a plurality of voltages from the control logic 150. The address decoder 120 transmits the voltages received from the control logic 150 to word lines WL and selection lines. When the address decoder 120 is additionally connected to the memory cell array 110 through dummy word lines, the address decoder 120 drives dummy word lines on the basis of the decoded address. The address decoder 120 may include a row decoder decoding a row address, a column decoder decoding a column address and an address buffer storing a received address ADDR.

The page buffer circuit 130 is connected to the memory cell array 110 through bit lines BL and is connected to the data input/output circuit 140 through data lines DL. The page buffer circuit 130 can operate in response to a control of the control logic 150. That is, the page buffer circuit 130 can bias bit lines BL in response to a control of the control logic 150.

The page buffer circuit 130 receives data from the data input/output circuit 140 and writes the received data in the memory cell array 110. The page buffer circuit 130 reads data from the memory cell array 110 and transmits the read data to the data input/output circuit 140. For example, the page buffer circuit 130 can read data from a first storage area of the memory cell array 110 and write the read data in a second storage area of the memory cell array 110. That is, the page buffer circuit 130 performs a copy-back operation. The page buffer circuit 130 may include constituent elements such as a page buffer (or page register), a column select circuit, a sense amplifier, and a write driver.

The data input/output circuit 140 is connected to the page buffer circuit 130 through data lines DL. The data input/output circuit 140 may operate in response to a control of the control logic 150. The data input/output circuit 140 may be configured to exchange data with the outside. The data input/output circuit 140 can transmit data being received from the outside to the page buffer circuit 130 through data lines DL. The data input/output circuit 140 can output data being transmitted through data lines DL to the outside. The data input/output circuit 140 may include a constituent element such ad a data buffer.

The control logic 150 is connected to the memory cell array 110, the address decoder 120, the page buffer circuit 130 and the data input/output circuit 140. The control logic 150 is configured to control an overall operation of the nonvolatile memory device 100. The control logic 150 operates in response to a control signal CMD being transmitted from the outside.

The control logic 150 includes a voltage generating unit 151. The voltage generating unit 151 is supplied with a power supply from the outside. For example, the voltage generating unit 151 is supplied with a power supply voltage Vcc and a ground voltage Vss from the outside. In response to a control of the control logic 150, the voltage generating unit 151 can generate voltages having a plurality of levels from the power supply voltage Vcc and the ground voltage Vss. The voltage generating unit 151 can generate various voltages such as a high voltage Vpp, a program voltage Vpgm, a pass voltage Vpass, a read voltage Vread, an erase voltage Vers, etc.

Voltages generated by the voltage generating unit 151 are supplied to the address decoder 120 and the memory cell array 110 under the control of the control logic 150. For example, in a program operation, the program voltage Vpgm and the pass voltage Vpass may be supplied to the address decoder 120. In a read operation, the read voltage Vread may be supplied to the address decoder 120. In an erase operation, the erase voltage Vers may be supplied to the memory cell array 110.

As described above, the memory cell array 110 includes a plurality of memory blocks. In an erase operation, a conventional memory cell array performs an erase operation by a memory block unit.

The memory cell array 110 in accordance with an embodiment of the inventive concept, in an erase operation, performs an erase operation by a sub memory block unit. Each memory block may include a plurality of sub-blocks. That is, in an erase operation, the memory cell array 110 can perform an erase operation on the basis of sub-blocks requested to be erased among the sub-blocks.

The nonvolatile memory device 100 may be a flash memory, a magnetic random access memory (MRAM), a spin-transfer torque MRAM, a conductive bridging RAM (CBRAM), a ferroelectric RAM (FeRAM), a phase change RAM (PRAM) which is called an ovonic unified memory (OUM), a resistive RAM (RRAM), a nanotube RRAM, a polymer RAM (PoRAM), a nanotube floating gate memory (NFGM), a holographic memory, a molecular electronics memory device, or an insulator resistance change memory.

Figure 2:
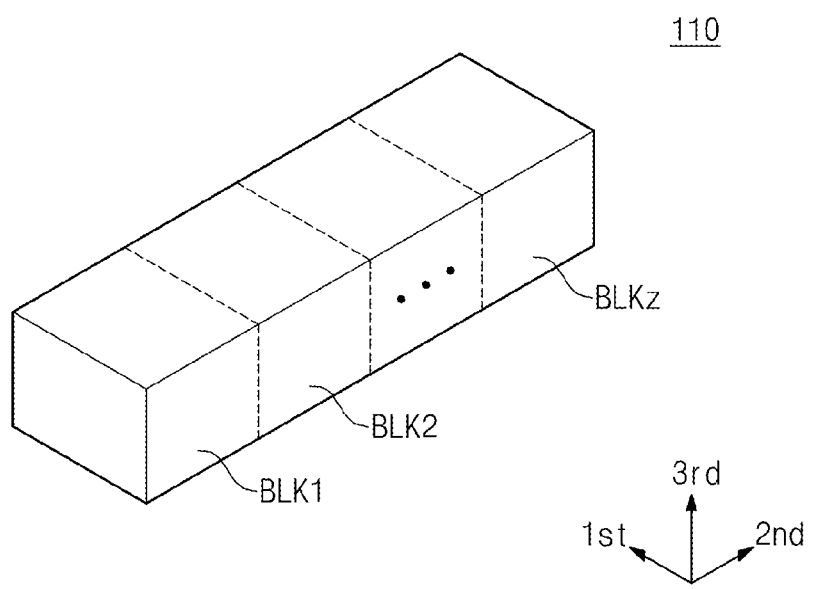
FIG. 2 is a block diagram illustrating a memory cell array illustrated in FIG. 1.

FIG. 2 is a block diagram illustrating a memory cell array illustrated in FIG. 1. Referring to FIG. 2, the memory cell array 110 includes a plurality of memory blocks BLK1~BLKz. According to an embodiment of the inventive concept, each memory block BLK has a three-dimensional structure (or a vertical structure). For example, each memory block BLK includes structures extending along first through third directions. Each memory block BLK includes a plurality of NAND strings NS extending along the second direction. For example, NAND strings NS may be provided to be spaced a specific distance apart from one another along the first and third directions.

Figure 3:
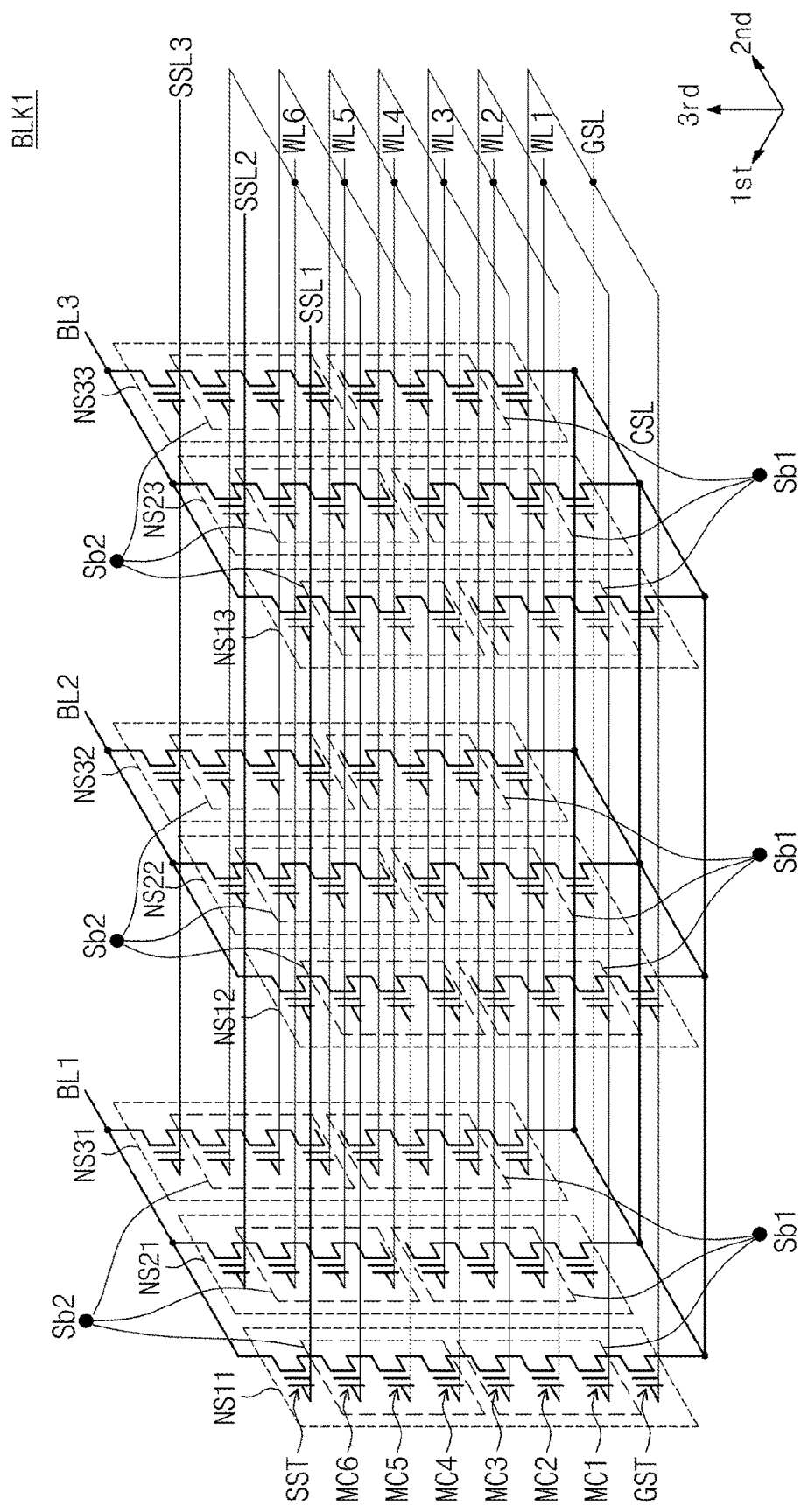
FIG. 3 is an equivalent circuit of a memory block illustrated in FIG. 2.

Each NAND string NS, as illustrated in FIG. 3, is connected to a bit line BL, a string select line SSL, a plurality of word lines WL, a ground select line GSL, and a common source line CSL. Each memory block is connected to a plurality of bit lines BL, a plurality of string select lines SSL, a plurality of word lines WL, a ground select line GSL and a common source line CSL. FIG. 3 is an equivalent circuit of a memory block illustrated in FIG. 2. A memory block BLK1 illustrated in FIG. 3 may be any one of the memory blocks BLK1~BLKz illustrated in FIG. 2.

Referring to FIGS. 2 and 3, NAND strings NS11, NS21 and NS31 are disposed between a first bit line BL1 and a common source line CSL along the third direction. NAND strings NS12, NS22 and NS33 are disposed between a second bit line BL2 and the common source line CSL along the third direction. NAND strings NS13, NS23 and NS33 are disposed between a third bit line BL3 and the common source line CSL along the third direction.

A string select transistor SST of each NAND string NS is connected to a corresponding bit line BL. A ground select transistor GST of each NAND string NS is connected to the common source line CSL. A plurality of memory cells MC1~MC6 are disposed between a string select transistor SST and a ground select transistor GST of each NAND string NS.

The NAND strings NS are defined by a row unit and a column unit. NAND strings NS connected to one bit line in common form one column. For example, the NAND strings NS11, NS21 and NS31 connected to the first bit line BL1 correspond to a first column. The NAND strings NS12, NS22 and NS32 connected to the second bit line BL2 correspond to a second column. The NAND strings NS13, NS23 and NS33 connected to the third bit line BL3 correspond to a third column.

NAND strings NS connected to one string select line SSL form one row. For example, the NAND strings NS11, NS12 and NS13 connected to a first string select line SSL1 form a first row. The NAND strings NS21, NS22 and NS23 connected to a second string select line SSL2 form a second row. The NAND strings NS31, NS32 and NS33 connected to a third string select line SSL3 form a third row.

In each NAND string NS, a height is defined. In each NAND string NS, a height of the ground select transistor GST is defined as 1. A height of the first memory cell MC1 adjacent to the ground select transistor GST is defined as 2. A height of the string select transistor SST is defined as 8. A height of the sixth memory cell MC6 adjacent to the string select transistor SST is defined as 7. A height of the memory cell MC increases with the distance from the ground select transistor GST. A height of the memory cell MC may increase along the second direction. As a result, the first through sixth memory cells MC1~MC6 are defined to have second through seventh heights.

NAND strings NS of the same row share the ground select line GSL. NAND strings NS of the different rows also share the ground select line GSL. In NAND strings NS of the same row, memory cells MC of the same height share a word line WL. Word lines WL of NAND strings NS having the same height and corresponding to different rows are connected in common. That is, memory cells MC having the same height share a word line WL.

Memory cells MC of the first through third rows having the second height are connected to the first word line WL1. Memory cells MC of the first through third rows having the third height are connected to the second word line WL2. Memory cells MC of the first through third rows having the fourth height are connected to the third word line WL3. Memory cells MC of the first through third rows having the fifth height are connected to the fourth word line WL4. Memory cells MC of the first through third rows having the sixth height are connected to the fifth word line WL5. Memory cells MC of the first through third rows having the seventh height are connected to the sixth word line WL6.

NAND strings NS of the same row share a string select line SSL. NAND strings NS of different rows are connected to the different string select lines SSL1, SSL2 and SSL3 respectively. The first through third string select lines SSL1 SSL3 have the eight height respectively.

String select transistors SST connected to the first string select line SSL1 are defined as first string select transistors SST1. String select transistors SST connected to the second string select line SSL2 are defined as second string select transistors SST2. String select transistors SST connected to the third string select line SSL3 are defined as third string select transistors SST3.

The NAND strings NS are connected to the common source line CSL in common.

As illustrated in FIG. 3, word lines WL of the same height are connected in common. Thus, when a word line WL of a specific height is selected, NAND strings NS connected to the selected word line WL may be all selected.

NADN strings NS of different rows are connected to different string select lines SSL. Thus, the first through third string select lines SSL1~SSL3 are selected or unselected and thereby the NAND string select lines NS can be electrically connected to or disconnected from a bit line. For example, NAND strings NS corresponding to a selected string select line SSL among NAND strings NS connected to the same word line WL can be electrically connected to a bit line. In this case, NAND strings NS corresponding to an unselected string select line SSL can be electrically isolated from a bit line.

A row of NAND strings NS can be selected by selecting or unselecting the first through third string select lines SSL1~SSL3. A column of NAND strings NS of a selected row can be selected by selecting bit lines BL1~BL3.

In program and read operations, one of the first through third string select lines SSL1~SSL3 may be selected. That is, the program and read operations may be performed by a row unit of the NAND strings NS11~NS13, NS21~NS23 and NS31~NS33. In program and read operations, a select voltage is applied to a selected word line of a selected row and an unselect voltage is applied to unselected word lines. The select voltage may be a program voltage Vpgm or a select read voltage Vrd. The unselect voltage may be a pass voltage Vpass or an unselect read voltage Vread. That is, the program and read operations may be performed by a word line unit of a selected row of the NAND strings NS11~NS13, NS21~NS23 and NS31~NS33.

According to an embodiment of the inventive concept, the memory block BLK1 may be divided into a first sub-block Sb1 and a second sub-block Sb2 along the second direction. However, the inventive concept is not limited thereto. The memory bock BLK1 may be divided into a plurality of sub-blocks.

According to an embodiment of the inventive concept, the memory block BLK1 may be erased by a sub-block unit. That is, each sub-block can be independently erased.

Figure 4:
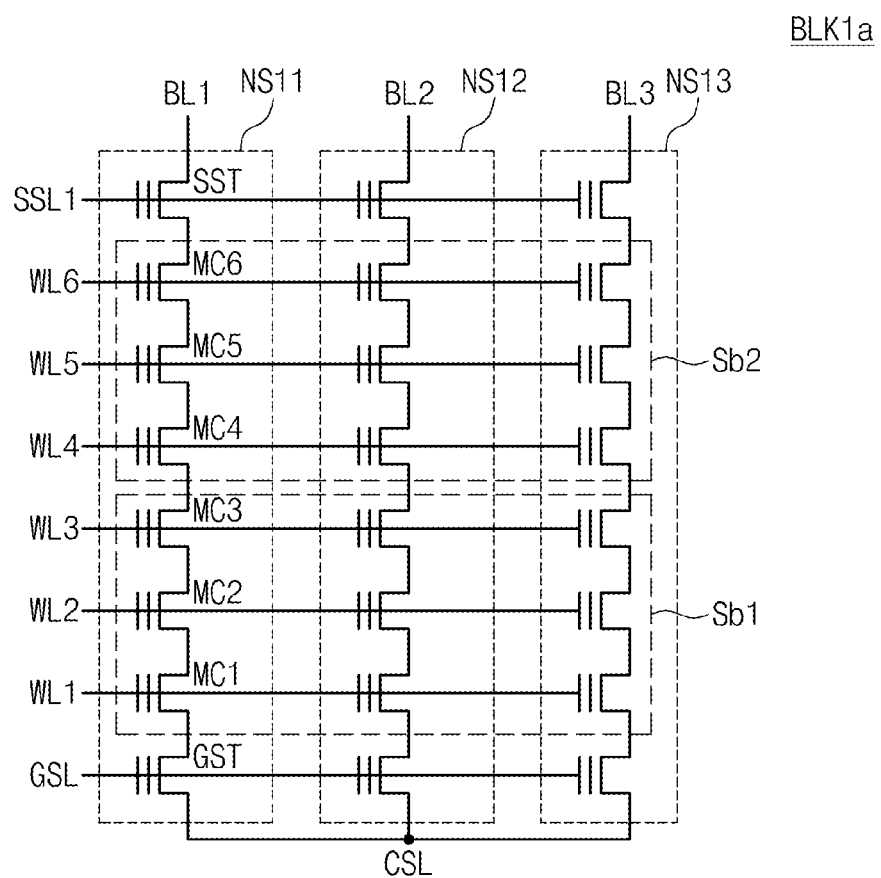
FIG. 4 is a circuit illustrating NAND strings of the same row of a memory block illustrated in FIG. 3.

FIG. 4 is a circuit illustrating NAND strings of the same row of a memory block illustrated in FIG. 3. A memory block BLK1a illustrated in FIG. 4 includes the NAND strings NS11, NS12 and NS13 connected to the first string select line SSL1 and illustrates a part connected to the first string select line SSL1 of the BLK1 of FIG. 3. An erase operation of NAND strings connected to the second and third string select lines SSL2 and SSL3 may be performed by the same method as the NAND strings NS11, NS12 and NS13 connected to the first string select line SSL1.

Referring to FIG. 4, the first through third memory cells MC1~MC3 having second through fourth heights form the first sub-block Sb1. The fourth through sixth memory cells MC4~MC6 having fifth through seventh heights form the second sub-block Sb2. In an erase operation, the first sub-block Sb1 or the second sub-block Sb2 may be erased. In an erase operation, it is assumed that the second sub-block Sb2 is erased. In an erase operation, memory cells included in the second sub-block Sb2 corresponding to the first string select line SSL1 are erased. After that, erased memory cells corresponding to the first string select line SSL1 are erase-verified.

FIG. 5 is a table illustrating voltage conditions being applied to a memory block illustrated in FIG. 4 in an erase operation. Referring to FIG. 5, an erase voltage Vers is applied to a substrate S. The memory cells MC are provided along rows and columns on the substrate S and are stacked in a direction crossing the substrate S to have a three-dimensional structure. The ground select line GSL is floated. The first through third word lines WL1~WL3 corresponding to the first sub-block Sb1 are floated. A word line erase voltage Vwe is applied to the fourth through sixth word lines WL4~WL6 corresponding to the second sub-block Sb2. The first string select line SSL1 is floated. The second and third string select lines SSL2 and SSL3 are also be floated. Under the condition described above, the first sub-block Sb1 is not erased and the second sub-block Sb2 may be erased.

Figure 6:
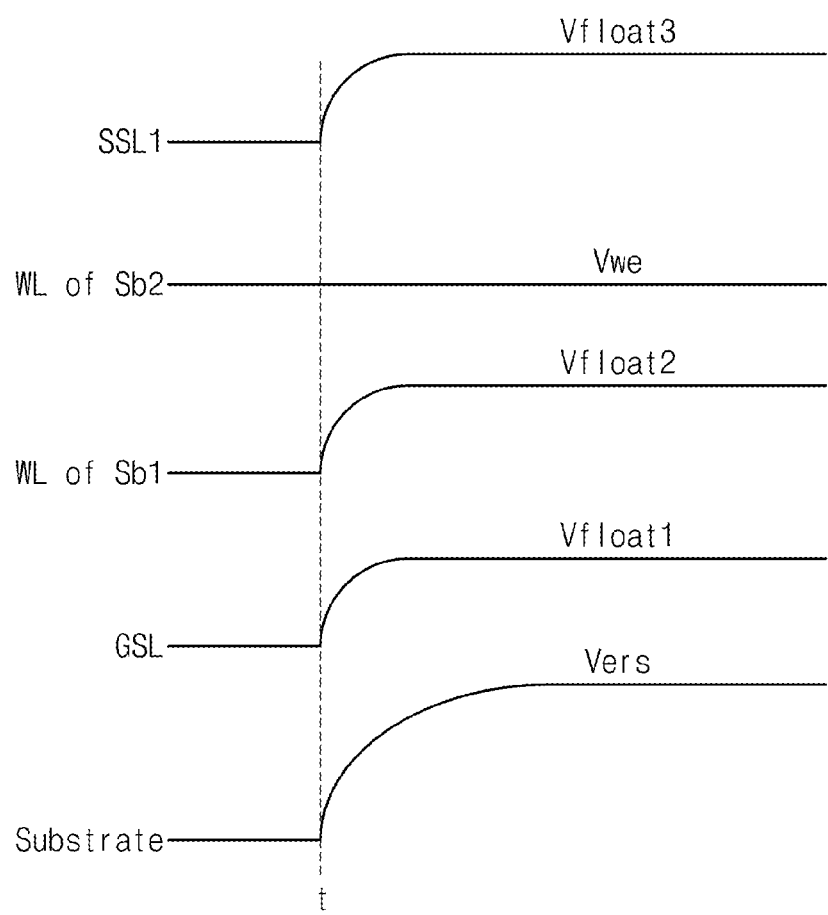
FIG. 6 is a timing diagram illustrating a voltage change of a memory block according to the voltage conditions illustrated in FIG. 5.

FIG. 6 is a timing diagram illustrating a voltage change of a memory block according to the voltage conditions illustrated in FIG. 5. Referring to FIGS. 5 and 6, an erase voltage Vers is applied to the substrate S at a first time (t) when an erase operation begins. The erase voltage Vers may be a high voltage. The erase voltage Vers applied to the substrate S may be supplied to vertical channels.

The ground select line GSL is floated at the first time (t). The ground select line GSL operates as a gate (or control gate) of the ground select transistor GST. The ground select line GSL undergoes coupling influence by a voltage change of the vertical channels. That is, as the erase voltage Vers applied to the vertical channels increases, a voltage of the ground select line GSL may increase. Thus, a voltage of the ground select line GSL increases to a first floating voltage Vfloat1.

As a result, a voltage applied to the vertical channels may be the erase voltage Vers and the gate voltage of the ground select transistor GST may be the first floating voltage Vfloat1. A difference between the erase voltage Vers and the first floating voltage Vfloat1 may not be great enough to induce a Fowler-Nordheim tunneling. Thus, the ground select transistor GST may be erase-prohibited.

At the first time (t), the first through third word lines WL1~WL3 corresponding to the first sub-block Sb1 are floated. The first through third word lines WL1~WL3 operate as a gate (or control gate) of the first through third memory cells MC1~MC3. The first through third memory cells MC1~MC3 undergo coupling influence by a voltage change of the vertical channels. That is, as the erase voltage Vers applied to the vertical channels increases, voltages of the first through third memory cells MC1~MC3 may increase. Thus, the voltages of the first through third memory cells MC1~MC3 may increase to a second floating voltage Vfloat2.

As a result, a voltage applied to the vertical channels may be the erase voltage Vers and the gate voltage of the first through third memory cells MC1~MC3 may be the second floating voltage Vfloat2. A difference between the erase voltage Vers and the second floating voltage Vfloat2 may not be great enough to induce a Fowler-Nordheim tunneling. Thus, the first through third memory cells MC1~MC3 may be erase-prohibited.

At the first time (t), the word line erase voltage Vwe is applied to the fourth through sixth word lines WL4~WL6 corresponding to the second sub-block Sb2. The fourth through sixth word lines WL4~WL6 operate as a gate (or control gate) of the fourth through sixth memory cells MC4~MC6. The word line erase voltage Vwe may be a low voltage. For example, the word line erase voltage Vwe may be a ground voltage Vss.

As a result, a voltage applied to the vertical channels may be the erase voltage Vers and the gate voltage of the fourth through sixth memory cells MC4~MC6 may be the second floating voltage Vfloat2. A difference between the erase voltage Vers and the word line erase voltage Vwe may induce a Fowler-Nordheim tunneling. For example, levels of the erase voltage Vers and the word line erase voltage Vwe are set so that a Fowler-Nordheim tunneling occurs. Thus, the fourth through sixth memory cells MC4~MC6 of the memory block BLK1a may be erased.

At the first time (t), the string select line SSL is floated. The string select line SSL operates as a gate (or control gate) of the string select transistor SST. The string select line SSL undergoes coupling influence by a voltage change of the vertical channels. That is, as the erase voltage Vers applied to the vertical channels increases, a voltage of the string select line SSL may increase. Thus, the voltage of the string select line SSL may increase to a third floating voltage Vfloat3.

As a result, a voltage applied to the vertical channels may be the erase voltage Vers and the gate (or control gate) of the string select transistor SST may be the third floating voltage Vfloat3. A difference between the erase voltage Vers and the third floating voltage Vfloat3 may not be great enough to induce a Fowler-Nordheim tunneling. Thus, the string select transistor SST may be erase-prohibited.

As described above, the fourth through sixth memory cells MC4~MC6 corresponding to the second sub-block Sb2 of the memory block BLK1a are erased. The first through third memory cells MC1~MC3 corresponding to the first sub-block Sb1 of the memory block BLK1a are erase-prohibited.

Adjacent word lines between the first and second sub-blocks may undergo coupling influence from each other. For example, the word line erase voltage Vwe is applied to the fourth word line WL4 of the second sub-block Sb2 but the third word line WL3 of the first sub-block Sb1 is floated. Thus, a voltage of the third word line WL3 may undergoes coupling influence by the word line erase voltage Vwe of the fourth word line WL4. As a result, gate voltages of memory cells connected to the third word line WL3 may not be sufficiently increased based on the erase voltage Vers supplied to the vertical channels. Thus, the third memory cell MC3 corresponding to the erase-prohibited first sub-block Sb1 may be erased.

The third word line WL3 of the first sub-block Sb1 which are not erase-requested may undergo coupling influence by the fourth word line WL4 of the second sub-block Sb2. However, the inventive concept is not limited thereto. That is, at least one word line among word lines of sub-block not erase-requested may undergo coupling influence by a word line of sub-block which is erase-requested.

Thus, it is necessary to backup data of a memory cell being coupling-affected among memory cells of sub-block which are not erase-requested and restore the backed-up data after an erase operation is performed. Data of the third memory cells MC3 of the first sub-block Sb1 closest to the second sub-block Sb2 which is erase-requested is backed-up. However, the inventive concept is not limited thereto and data of a plurality of memory cells may be backed-up.

Figure 7:
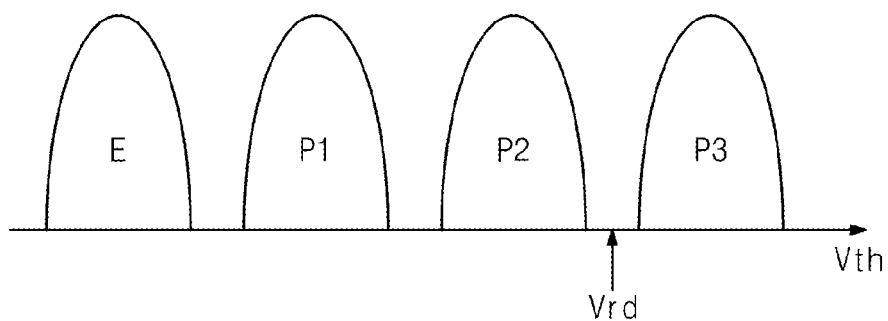
FIG. 7 is a diagram illustrating a distribution of a threshold voltage in a read operation of a third program state.
Figure 8:
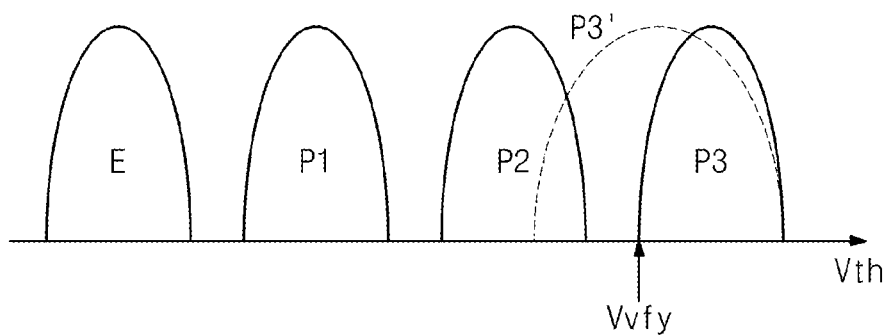
FIG. 8 is a diagram illustrating a distribution of a threshold voltage in a program verification operation of a third program state.

FIG. 7 is a diagram illustrating a distribution of a threshold voltage in a read operation of a third program state. FIG. 8 is a diagram illustrating a distribution of a threshold voltage in a program verification operation of a third program state.

Each memory cell may have an erase state E and first through third program states P1~P3 according to a distribution of threshold voltages. Each memory cell may be a memory cell storing 2 bits. The third program state P3 among the first through third program states P1~P3 is defined to have the highest program state. As described above, a part of data stored in memory cells closest to the sub-block which is erase-requested. Accordingly, a data backup of memory cells not erase-requested is needed.

According to an embodiment of the inventive concept, before an erase operation of the second sub-block Sb2, the control logic 150 (refer to FIG. 1) backs up data of a memory cell having the highest program state among the third memory cells MC3 having the fourth height.

Referring to FIG. 7, under the control of the control logic 150, a backup read voltage Vrd may be applied to the third word line WL3 having the fourth height. A high voltage may be applied to the remaining word lines except the third word line WL3. In response to the backup read voltage Vrd, a read operation of memory cells having the third program state P3 among the third memory cells MC3 may be performed. After that, under the control of the control logic 150, an erase operation of the second sub-block Sb2 may be performed.

According to an embodiment of the inventive concept, after the read operation of the third program state P3, the control logic 150 can store read data of the third program state P3. The control logic 150 can back the read data up to the page buffer circuit 130.

Referring to FIG. 8, when memory cells of the second sub-block Sb2 are erased, threshold voltages of the third memory cells having the fourth height may be changed due to a coupling phenomenon. As illustrated in FIG. 8, memory cells having the third program state P3 among the third memory cells are changed to a third program P3' by coupling influence. As a result, threshold voltages of parts of memory cells having the third program state may be lowered.

According to an embodiment of the inventive concept, under the control of the control logic 150, the memory cells MC3 having the fourth height are reprogrammed based on data of the third program state P3 backed up by the page buffer circuit 130. As a result, the third memory cells having the third program state P3' can be reprogrammed by coupling influence.

The control logic 150 can provide a program voltage of a new condition to the address decoder 120 to perform a reprogram operation of memory cells having the third program state. That is, the control logic 150, in a reprogram operation, can supply a new program voltage and the pass voltage Vpass to the address decoder 120. On the basis of the new program voltage, the control logic 150 controls so that memory cells having the third program state P3' reach a program verification voltage Vvfy.

Figure 9:
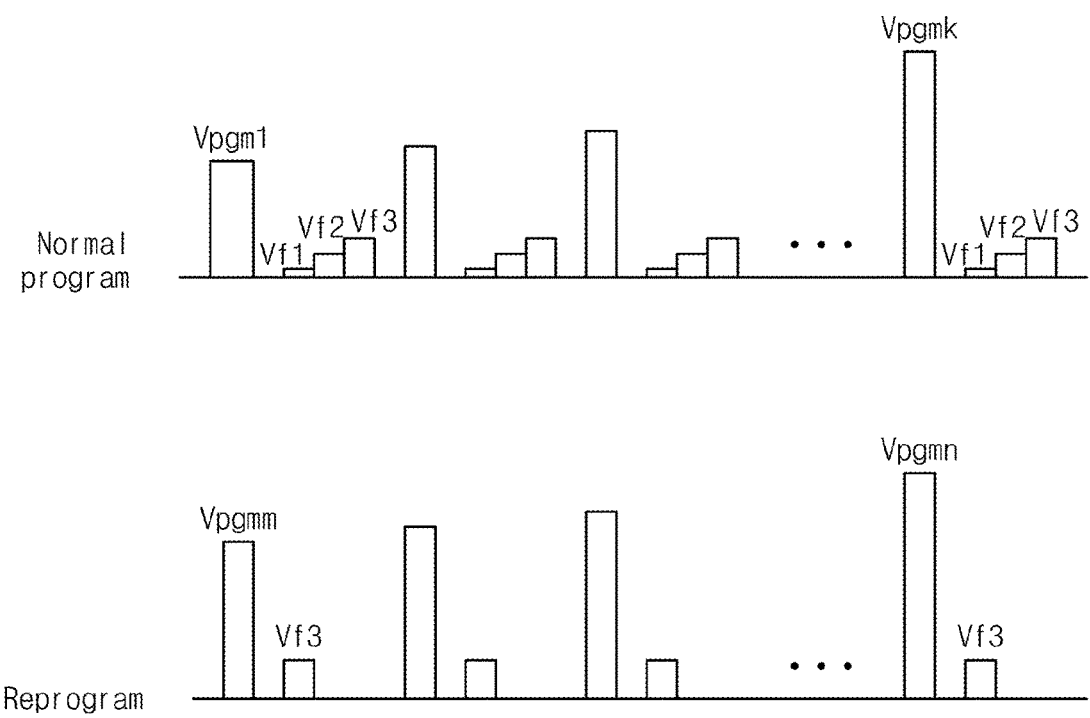
FIG. 9 is a graph illustrating a program voltage and a verification voltage in a program verification operation of a third program state.

FIG. 9 is a graph illustrating a program voltage and a verification voltage in a program verification operation of a third program state. Referring to FIG. 9, a program operation of the third word line WL3 adjacent to the erase-requested sub-block illustrated in FIG. 4 begins. A program operation before an erase operation of the erase-requested sub-block is performed is called a normal program NP and a program operation after an erase operation of the erase-requested sub-block is performed is called a reprogram RP. The normal program NP programs new write data in memory cells of an erase state. The reprogram RP programs the backed-up data in memory cells in which data is written again.

Before an erase operation of the erase-requested sub-block is performed, a normal program NP operation of memory cells connected to the third word line WL3 is performed. In this case, first through kth program voltages Vpgm1~Vpgmk may be provided to the third word line WL3 to perform a normal program operation. The first through kth program voltages Vpgm1~Vpgmk are described to be a normal program voltage. After a program voltage is applied, first through third program verify voltages Vf1~Vf3 may be provided to the third word line WL3 to verify a normal program. That is, it is verified whether threshold voltages of the programmed memory cells reach the first through third program verify voltages Vf1~Vf3.

For example, after the first program voltage Vpam1 for a normal program NP operation is provided to the third word line WL3, the first through third program verify voltages Vf1~Vf3 for a normal program NP verification are provided. After that, a program loop of performing a program verify read is repeatedly performed until threshold voltages of normal-programmed memory cells reach the third program verify voltage Vf3. Levels of the first through kth program voltages Vpgm1~Vpgmk may be increased by a predetermined level every time after each program verification is performed.

After an erase operation of the erase-requested sub-block is performed, a reprogram operation RP of memory cells connected to the third word line WL3 is performed. According to an embodiment of the inventive concept, a reprogram operation is performed based on memory cells having the highest program state. Mth through nth program voltages Vpgmm~Vpgmn may be provided to the third word line WL3 to perform the reprogram operation. The mth through nth program voltages Vpgmm~Vpgmn are described to be a reprogram voltage. Herein, the m is an integer greater than 1 and smaller than k. The n is an integer greater than or equal to k.

According to an embodiment of the inventive concept, after a program voltage is applied, the third verify voltage Vf3 for reprogram verification may be provided to the third word line WL3. That is, it is verified whether threshold voltages of the reprogrammed memory cells reach the third program verify voltage Vf3. After that, a reprogram loop of performing a program verify read is repeatedly performed until threshold voltages of reprogrammed memory cells reach the third program verify voltage Vf3. Levels of the mth through nth program voltages Vpgmm~Vpgmn may be increased by a predetermined level every time after each program verification is performed.

Figure 10:
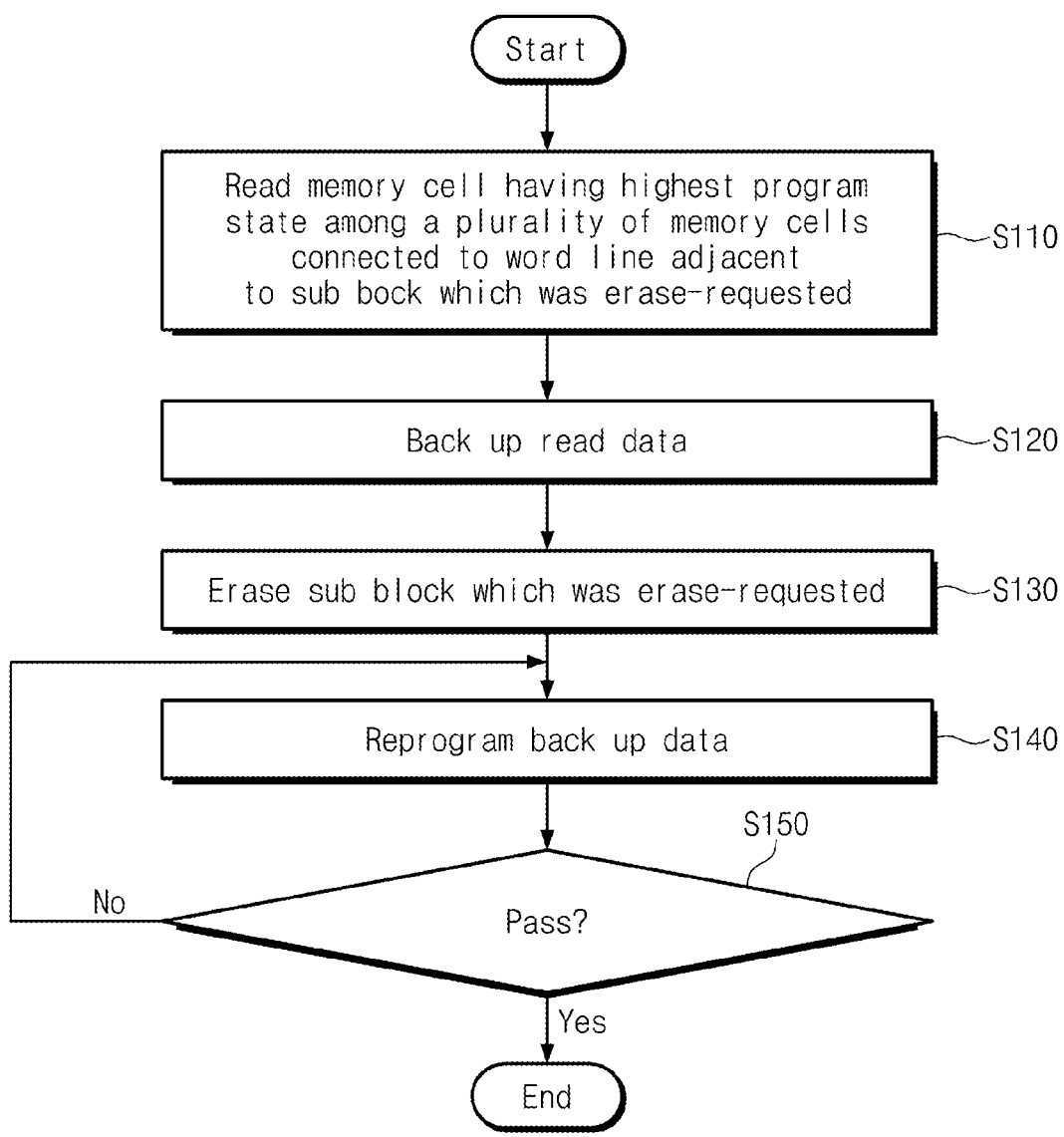
FIG. 10 is a flowchart illustrating an operation of a nonvolatile memory device in accordance with an embodiment of the inventive concept.

FIG. 10 is a flowchart illustrating an operation of a nonvolatile memory device in accordance with an embodiment of the inventive concept. Referring to FIGS. 5 and 10, read, backup and restoration operations of memory cells connected to one word line closest to the erase-requested second sub-block Sb2 are described. However, the inventive concept is not limited thereto. At least one word line among word lines adjacent to the erase-requested second sub-block Sb2 may be selected.

In a step S110, the control logic 150 (refer to FIG. 1) controls so that a read operation of a memory cell having the highest program state among a plurality of memory cells connected to the third word line WL3 closest to the erase-requested second sub-block Sb2 is performed. In a step S120, the control logic 150 backs up the read data of a memory cell having the highest program state among a plurality of memory cells connected to the third word line WL3. For example, the control logic 150 can back the read data up to the page buffer circuit 130 (refer to FIG. 1).

In a step S130, the control logic 150 performs an erase operation of the erase-requested second sub-block Sb2. In a step S140, the control logic 150 reprograms corresponding memory cells on the basis of the backed-up data. The control logic 150 can apply a reprogram voltage needed for a reprogram operation to the word line WL3. In a step 150, the control logic 150 verifies whether threshold voltages of the reprogrammed memory cells reach a program verify voltage Vvfy.

In a reprogram operation, in the case that threshold voltages of the reprogrammed memory cells reach a program verify voltage Vvfy (Yes), the control logic 150 finishes a reprogram operation. In a reprogram operation, in the case that threshold voltages of the reprogrammed memory cells do not reach a program verify voltage Vvfy (No), the control logic 150 performs a reprogram of the backed-up data again. That is, the control logic 150 repeatedly performs a reprogram loop of performing a program verify read of the backed-up data until threshold voltages of the reprogrammed memory cells reach a program verify voltage Vvfy.

As described above, the nonvolatile memory device 100 erases memory cells by a sub-block unit. In the case that data of a memory cell of an adjacent sub-block is unwillingly erased due to a coupling phenomenon of an erase-requested sub-block, the nonvolatile memory device 100 can restore data through the backup operation. As a result, a speed of the nonvolatile memory device 100 can be improved.

Figure 11:
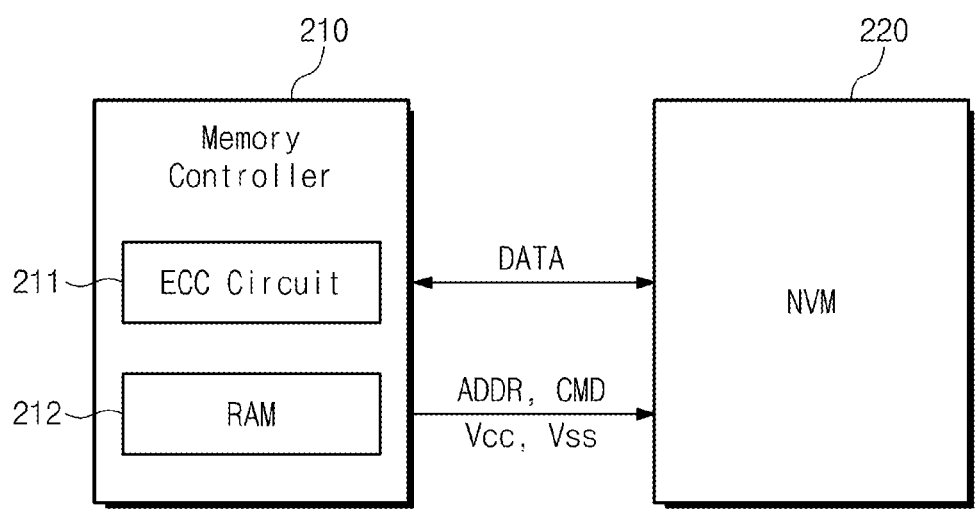
FIG. 11 is a block diagram illustrating a storage device in accordance with another embodiment of the inventive concept.

FIG. 11 is a block diagram illustrating a storage device in accordance with another embodiment of the inventive concept. Referring to FIG. 11, a storage device 200 includes a memory controller 210 and a nonvolatile memory device 220. The storage device 200 can perform write (or program), read and erase operations under the control of a host device (not shown). The storage device 200 is supplied with power from the host device and can exchange a plurality of signals with the host device. The storage device 200 may include a nonvolatile memory such as a flash memory, a PRAM, a MRAM, an RRAM, etc. The storage device 200 may be a detachable memory card which can be attached to or detached from the host device, or a solid state drive.

The storage device 200 includes a memory controller 210 and a storage medium 220. The memory controller 210 is configured to control the storage medium 220 according to a request of the host device. The memory controller 210 transmits a plurality of signals to the storage medium 220. For example, the memory controller 210 transmits a plurality of signals based on a control signal CMD, an address signal ADDR, a ground voltage signal Vss, and a power supply voltage signal Vcc to the storage medium 220. The memory controller 210 may be configured to exchange data with the storage medium 220.

The memory controller 210 performs a read operation of memory cells connected to a word line closest to an erase-requested sub-block before an erase operation of the erase-requested sub-block is performed. The word line closest to the erase-requested sub-block is defined as a backup word line.

The memory controller 210 transmits a backup command signal to the storage medium 220 for a read operation of memory cells connected to the backup word line. The storage medium 220 performs a read operation of memory cells connected to the backup word line in response to the backup command signal. The backup command signal may include a select read voltage to be applied to the backup word line and an unselect read voltage to be applied to an unselect word line.

The memory controller 210 transmits an erase request signal to the storage medium 220 for an erase operation of an erase-requested sub-block. The storage medium 220 can perform an erase operation of the sub-block in response to the erase request signal. The storage device 200 can use various memories as the storage medium 220. The storage medium 220 can be embodied by a nonvolatile memory. The storage medium 220 may have the same structure as the nonvolatile memory device 100 illustrated in FIG. 1.

The storage medium 220 includes a memory cell array. For example, the storage medium 220 may include a memory cell array illustrated in FIG. 1. Each block of the storage medium 220 may have the same structure as the block BLK1 illustrated in FIG. 3. Each block of the storage medium 220 may be erased by a sub-block unit, similar to the block BLK1 illustrated in FIG. 3. Each block of the storage medium 220 can be described based on the block BLK1 illustrated in FIG. 3.

The memory controller 210 includes an error correction circuit 211 and a RAM 212. In a program operation, the error correction circuit 211 performs an error correction encoding on data being stored in the storage medium 220. The encoded storage data is stored in the storage medium 220. In a read operation, the error correction circuit 211 performs an error correction decoding on data being transmitted from the storage medium 220.

The RAM 212 can be embodied by a volatile memory such as a DRAM and a SRAM. The RAM 212 temporarily stores data read when a read operation is performed on data stored in the storage medium 220. The memory controller 210 backs up data of a memory cell connected to a word line which undergoes coupling influence among memory cells of a sub-block which is not erase-requested. The memory controller 210 can store backed-up data in the RAM 212.

Figure 12:
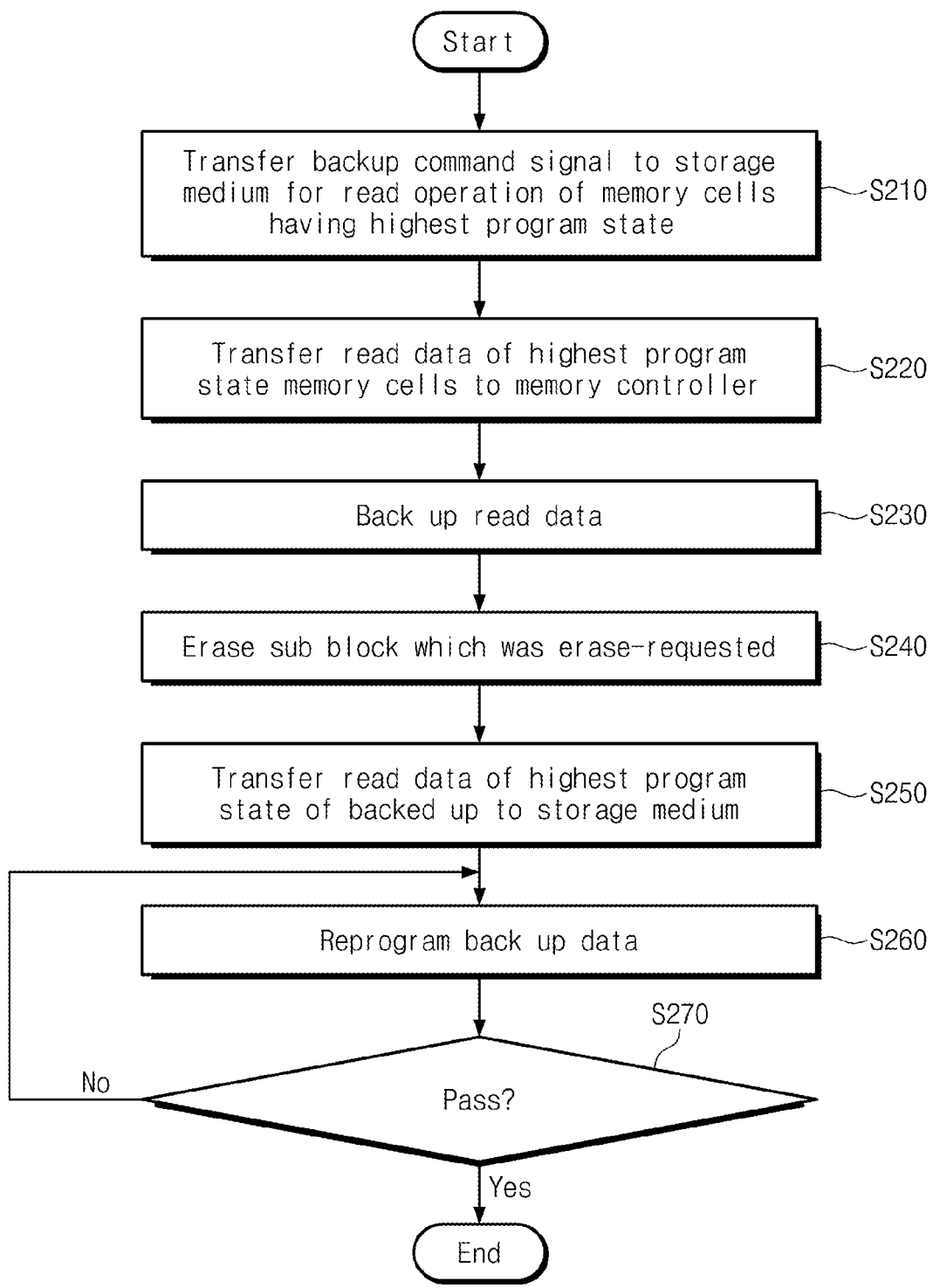
FIG. 12 is a flowchart illustrating an operation of the storage device illustrated in FIG. 11 in accordance with an embodiment of the inventive concept.

FIG. 12 is a flowchart illustrating an operation of the storage device illustrated in FIG. 11 in accordance with an embodiment of the inventive concept. Referring to FIGS. 11 and 12, in a step S210, the memory controller 210 transmits a backup command signal to the storage medium 220 for a read operation of memory cells having the highest program state among a plurality of memory cells connected to the backup word line. The storage medium 220 performs a read operation of a memory cell having the highest program state in response to the backup command signal.

In a step S220, the storage medium 220 transmits read data of the memory cell having the highest program state to the memory controller 210. In a step S230, the memory controller 210 backs the read data up to the RAM 212. In a step S240, the memory controller 210 transmits an erase request signal to the storage medium 220. The storage medium 220 erases an erase-requested sub-block in response to the erase request signal. In a step S250, the memory controller 210 transmits the backed-up data to the storage medium 220. In a step S260, the memory controller 210 reprograms a memory cell having the highest program state on the basis of the backed-up data. In a step S270, the memory controller 210 verifies whether threshold voltages of the reprogrammed memory cells reach a program verify voltage.

In a reprogram verify operation, in the case that threshold voltages of the reprogrammed memory cells reach a program verify voltage having the highest program state (Yes), the memory controller 210 finishes a reprogram operation. In a reprogram operation, in the case that threshold voltages of the reprogrammed memory cells do not reach a program verify voltage having the highest program state (No), the memory controller 210 performs a reprogram of the backed-up data again. That is, the memory controller 210 repeatedly performs a reprogram loop of performing a program verify read of the backed-up data until threshold voltages of the reprogrammed memory cells reach a program verify voltage having the highest program state.

Figure 13:
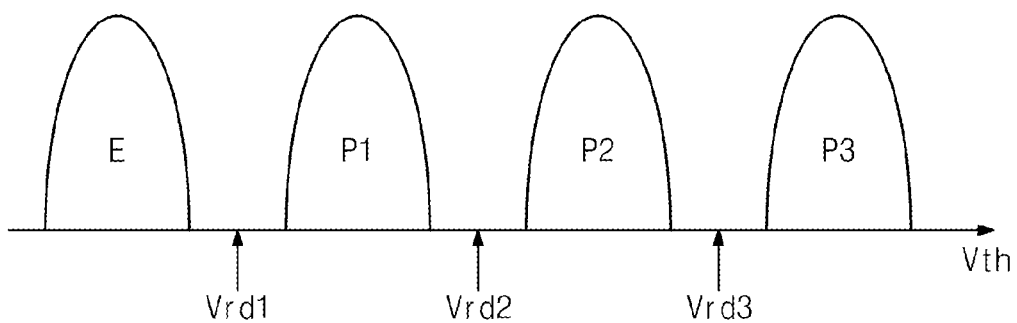
FIG. 13 is a diagram illustrating a distribution of a threshold voltage in a read operation of a storage device.

FIG. 13 is a diagram illustrating a distribution of a threshold voltage in a read operation of a storage device. Referring to FIGS. 11 and 13, each memory cell is divided into an erase state E, and first through third program states P1~P3. Each memory cell may be a memory cell storing 2 bits. The third program state P3 among the first through third program states P1~P3 is defined to have the highest program state.

In a read operation, first through third select read voltages Vrd1, Vrd2 and Vrd3 are provided to the backup word line and an unselect read voltage is provided to an unselect word line. The first select read voltage Vrd1 has a voltage level between the erase state E and the first program state P1, the second select read voltage Vrd2 has a voltage level between the first and second program states P1 and P2 and the third select read voltage Vrd3 has a voltage level between the second and third program states P2 and P3.

When applying the first select read voltage Vrd1, a memory cell having the erase state E becomes an on-cell and a memory cell having the first through third program states P1, P2 and P3 becomes an off-cell. When applying the second select read voltage Vrd2, a memory cell having the erase state E and the first program state P1 becomes an on-cell and a memory cell having the second and third program states P2 and P3 becomes an off-cell. When applying the third select read voltage Vrd3, a memory cell having the erase state E and the first and second program states P1 and P2 becomes an on-cell and a memory cell having the third program state P3 becomes an off-cell. According to the read operation condition, the memory controller 210 reads data of memory cells connected to the backup word line.

Figure 14:
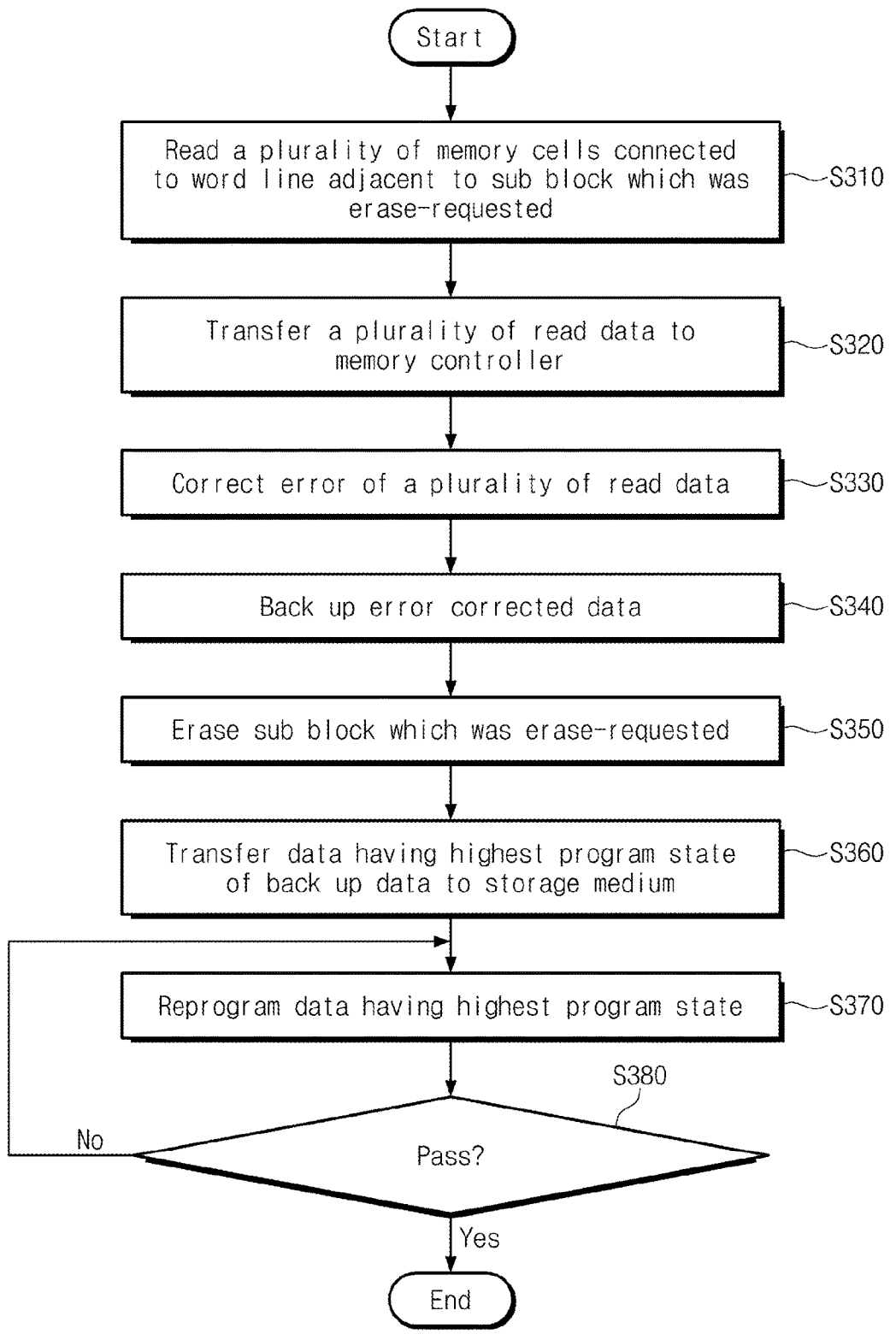
FIG. 14 is a flowchart illustrating an operation of the storage device illustrated in FIG. 11 in accordance with another embodiment of the inventive concept.

FIG. 14 is a flowchart illustrating an operation of the storage device illustrated in FIG. 11 in accordance with another embodiment of the inventive concept. Referring to FIGS. 11, 13 and 14, in a step S310, as illustrated in FIG. 13, the memory controller 210 performs a read operation of memory cells connected to a backup word line. The backup word line may be a word line closest to an erase-requested sub-block. The memory controller 210 transmits a backup command signal to the storage medium 220 for a read operation of a plurality of memory cells connected to the backup word line.

In a step S320, the storage medium 220 reads data of memory cells connected to the backup word line in response to a backup command signal received from the memory controller 210. The storage medium 220 outputs the read data to the memory controller 210. In a step S330, the memory controller 210 performs an error correction decoding on data read from the storage medium 220. In a step S340, the memory controller 210 stores the error correction decoded data in the RAM 212.

In a step S350, the memory controller 210 performs an erase operation of an erase requested sub-block after the error correction decoded data is backed up to the RAM 212. The memory controller 210 can transmit an erase voltage corresponding to the erase-requested sub-block to the storage medium 220. The storage medium 220 performs an erase operation of the erase-requested sub-block in response to the transmitted erase voltage. For example, a word line erase voltage is applied to word lines of the erase-requested sub-block and word lines of a sub-block which is not erase-requested are floated. The word line erase voltage may be a ground voltage Vss.

In a step S360, the memory controller 210 outputs data of memory cells having the highest program state among data stored in the RAM 212 to the storage medium 220. That is, the memory controller 210 transmits data and a backup program command signal for a reprogram operation to the storage medium 220. The backup program command signal may be a signal for reprogramming memory cells having the highest program state among data backed up to the RAM 212. The backup program command signal may include a backup program voltage being applied to a backup word line and an unselect voltage being applied to unselect word lines. In a reprogram operation, a backup program voltage is applied to the backup word line and a high voltage as an unselect voltage may be applied to unselect word lines.

According to an embodiment of the inventive concept, a program voltage condition being applied to the backup word line in a normal program operation may differ from a backup program voltage condition being to the backup word line in a reprogram operation. In a step S370, the storage medium 220 reprograms memory cells connected to the backup word line in response to data transmitted from the memory controller 210 and the backup program command signal.

In a step S380, the memory controller 210 verifies whether reprogrammed memory cells reach a program verify voltage. That is, the memory controller 210 verifies whether reprogrammed memory cells reach a backup program verify voltage through a program verification. The memory controller 210 can transmit information of the backup program verify voltage for the program verification to the storage medium 220. A normal program verify voltage condition before an erase operation of the erase-requested sub-block is performed may differ from a reprogram verify voltage condition after the erase operation is performed.

In a program verify operation, in the case that reprogrammed memory cells reach the backup program verify voltage (Yes), the memory controller 210 finishes a program operation. In a program verify operation, in the case that the reprogrammed memory cells do not reach the backup program verify voltage (No), the memory controller 210 performs a reprogram operation of the backed-up data again. That is, the memory controller 210 performs a reprogram of the backed-up data until the reprogrammed memory cells reach the backup program verify voltage.

FIG. 15 is a table illustrating a voltage condition being applied to a memory block in a program operation in accordance with an embodiment of the inventive concept. Referring to FIG. 15, the table shows an example that program parameters are controlled. In the table, an elapse time indicates time elapsed until a reprogram is performed after a normal program is performed with respect to memory cells MC. The memory cells MC may be memory cells connected to a word line closest to an erase-requested sub-block. A normal program may be applied to the memory cells connected to a word line closest to an erase-requested sub-block before an erase operation. A reprogram may be applied to the memory cells connected to a word line closest to an erase-requested sub-block after an erase operation.

The program parameter includes the increment of a program voltage VPGM, a start voltage of a program voltage VPGM, a program verify voltage and a precharge voltage of a bit line BL. A program of a nonvolatile memory is performed by performing a program loop several times. Each program loop includes a program step and a program verify step.

In a program step, a low voltage (for example, ground voltage) is applied to a bit line connected to a memory cell of which a threshold voltage will increase among memory cells of a page (for example, a selected page) in which a program operation is performed and a positive low voltage (for example, a power supply voltage) is applied to a bit line connected to a memory cell of which a threshold voltage will not increase. The page in which a program operation is performed, that is, the selected page is defined as a page which is not erase-requested closest to an erase-requested sub-block.

A positive low voltage (for example, a power supply voltage) is applied to a string select line corresponding to a selected page and a low voltage (for example, a ground voltage) is applied to the remaining string select lines. A low voltage (for example, a ground voltage) is applied to a ground select line GSL. A program voltage VPGM is applied to a word line connected to the selected page and a pass voltage VPASS is applied to the remaining word lines. The pass voltage VPASS may be a positive high voltage. The program voltage VPGM may be a positive high voltage higher than the pass voltage VPASS.

In a program verify step, bit lines BL are charged to a precharge voltage. An unselect read voltage VREAD is applied to a string select line corresponding to the selected page and a low voltage (for example, a ground voltage) is applied to the remaining string select lines. The unselect read voltage VREAD may be a positive high voltage. A program verify voltage VFY is applied to a word line connected to the selected page and the unselect read voltage VREAD is applied to the remaining word lines. The program verify voltage VFY may be a voltage corresponding to the lowest limit of a target threshold voltage distribution range of memory cells MC. The unselect read voltage VREAD is applied to the ground select line GSL. A ground voltage is applied to a common source line CSL. After predetermined develop time goes by, voltages of bit lines BL are latched and a program pass or a program fail is determined depending on a latch result.

Program loops are repeatedly performed so that memory cells MC of the selected page are programmed to target threshold voltages. When the program loops are performed, a program voltage level may be gradually increased. Increment of the program voltage VPGM among program parameters indicates the increment of the program voltage VPGM being increased every time when the program loop is performed. As the increment of the program voltage VPGM increases, a distribution width of threshold voltages of the programmed memory cells MC may increase.

A start voltage of the program voltage VPGM indicates a level of a program voltage VPGM being used in a first program loop. As a start voltage of the program voltage VPGM becomes lower, the lowest limit of threshold voltage distribution range of the programmed memory cells MC is reduced. The program verify voltage VFY may be a voltage being supplied to a word line connected to the selected page in a program verify step. As the program verify voltage VFY is reduced, the lowest limit of threshold voltage distribution range of the programmed memory cells MC may be reduced. A precharge voltage of bit line BL may be a voltage being supplied to bit lines BL in a program verify step. As the precharge voltage is reduced, a distribution width of threshold voltages of the programmed memory cells MC may increase.

As the elapse time T increases, the lowest limit and the highest limit of threshold voltage distribution of the memory cells MC in which a second programmed is performed are lowered and a distribution width thereof is increased.

A program parameter may be controlled according to the elapse time T so that threshold voltage distribution ranges of the memory cells MC have the same valley voltage. When the elapse time T is shorter than a first time T1, the increment of the program voltage VPGM is VIE the start voltage of the program voltage VPGM is VS1, the program verify voltage VFY is VFY1 and the precharge voltage is VPRE1.

When the elapse time T is longer than the first time T1 and shorter than a second time T2, a program parameter is controlled so that the lowest limit of threshold voltage distribution of the memory cells MC is lowered and a distribution width thereof increases. For example, the increment of the program voltage VPGM is controlled to VI2 higher than VI1, the start voltage of the program voltage VPGM is controlled to VS2 lower than VS1, the program verify voltage is controlled to VFY2 lower than VFY1 and the precharge voltage is controlled to VPRE2 lower than VPRE1.

When the elapse time T is longer than the second time T2, a program parameter is controlled so that the lowest limit of threshold voltage distribution of the memory cells MC is lowered and a distribution width thereof increases. For example, the increment of the program voltage VPGM is controlled to VI3 higher than VI2, the start voltage of the program voltage VPGM is controlled to VS3 lower than VS2, the program verify voltage is controlled to VFY3 lower than VFY2 and the precharge voltage is controlled to VPRE3 lower than VPRE2.

In FIG. 15, a program parameter is controlled by three steps according to the elapse time. However, the inventive concept is not limited thereto. A program parameter may be controlled by steps more or less than three steps.

In FIG. 15, the increment of the program voltage VPGM, the start voltage of the program voltage VPGM, the program verification voltage and the precharge voltage are controlled as program parameters. However, the program parameter is not limited to those things illustrated in FIG. 15. At least one of the increment of the program voltage VPGM, the start voltage of the program voltage VPGM, the program verification voltage and the precharge voltage may be controlled according to the elapse time. Parameters not described with reference to FIG. 15 may be controlled according to the elapse time.

Figure 16:
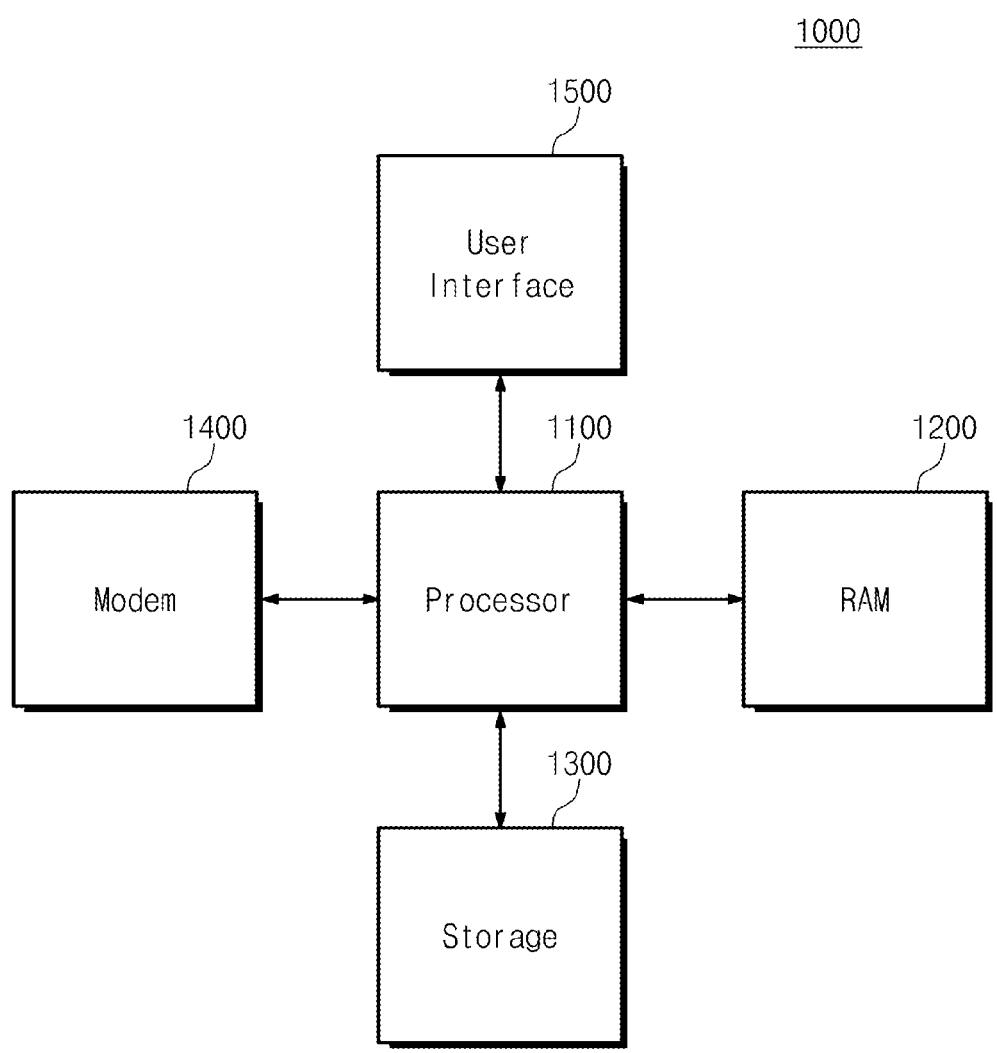
FIG. 16 is a block diagram illustrating a computing device in accordance with an embodiment of the inventive concept.

FIG. 16 is a block diagram illustrating a computing device in accordance with an embodiment of the inventive concept. Referring to FIG. 16, a computing device 1000 includes a processor 1100, a memory 1200, storage 1300, a modem 1400, and a user interface 1500. The processor 1100 can control an overall operation of the computing device 1000 and perform a logical operation. For example, the processor 1100 may be constituted by a system-on-chip (SoC).

The memory 1200 can communicate with the processor 1100. The memory 1200 may be an operation memory (or main memory) of the processor 1100 or the computing device 1000. The memory 1200 may include a volatile memory such as a SRAM (static RAM), a DRAM (dynamic RAM), a SDRAM (synchronous DRAM), etc. or a nonvolatile memory such as a flash memory, a PRAM (phase-change RAM), a MRAM (magnetic RAM), an RRAM (resistive RAM), a FRAM (ferroelectric RAM), etc.

The modem 1400 can perform a communication with an external device under the control of the processor 1100. For example, the modem 1400 can perform a wired or wireless communication with an external device. The modem 1400 can perform a communication on the basis of at least one of various wireless communication methods such as a long term evolution (LTE), a WiMax, a global system for mobile communication (GSM), a code division multiple access (CDMA), a Bluetooth, a near field communication (NFC), a WiFi, a radio frequency Identification (RFID), or at least one of various wired communication methods such as a universal serial bus (USB), a serial at attachment (SATA), a small computer small interface (SCSI), a Firewire, a peripheral component interconnection (PCI), etc.

The user interface 1500 can communicate with a user under the control of the processor 1100. For example, the user interface 1500 may include user input interfaces such as a keyboard, a keypad, a button, a touch panel, a touch screen, a touch pad, a touch ball, a camera, a mike, a gyroscope sensor, a vibration sensor, etc. The user interface 1500 may include user output interfaces such as a liquid crystal display (LCD), an organic light emitting diode (OLED) display, an active matrix OLED (AMOLED) display, a LED, a speaker, a motor, etc.

Figure 17:
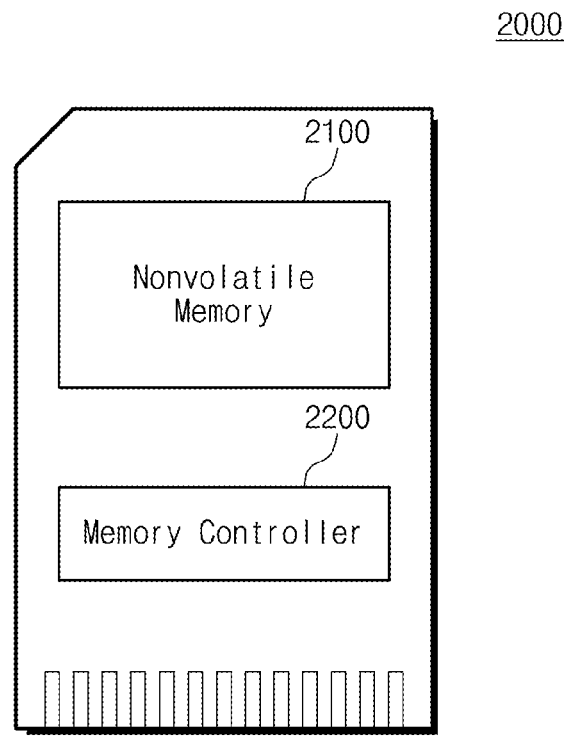
FIG. 17 illustrates a memory card in accordance with an embodiment of the inventive concept.

FIG. 17 illustrates a memory card in accordance with an embodiment of the inventive concept. Referring to FIG. 17, a memory card 2000 includes a nonvolatile memory 2100, a memory controller 2200 and a connector 2300. The nonvolatile memory 2100 can perform a reset according to some embodiments of the inventive concept. The connector 2300 can electrically connect the memory card 2000 to an external device (for example, a host). The memory card 2000 may be constituted by a personal computer memory card international association (PCMCIA) card, a compact flash (CF) card, a smart media card (SM, SMC), a memory stick, a multimedia card (MMC, RS-MMC, MMCmicro), a SD card (SD, miniSD, microSD, SDHC), a universal flash memory device (UFS), etc.

Figure 18:
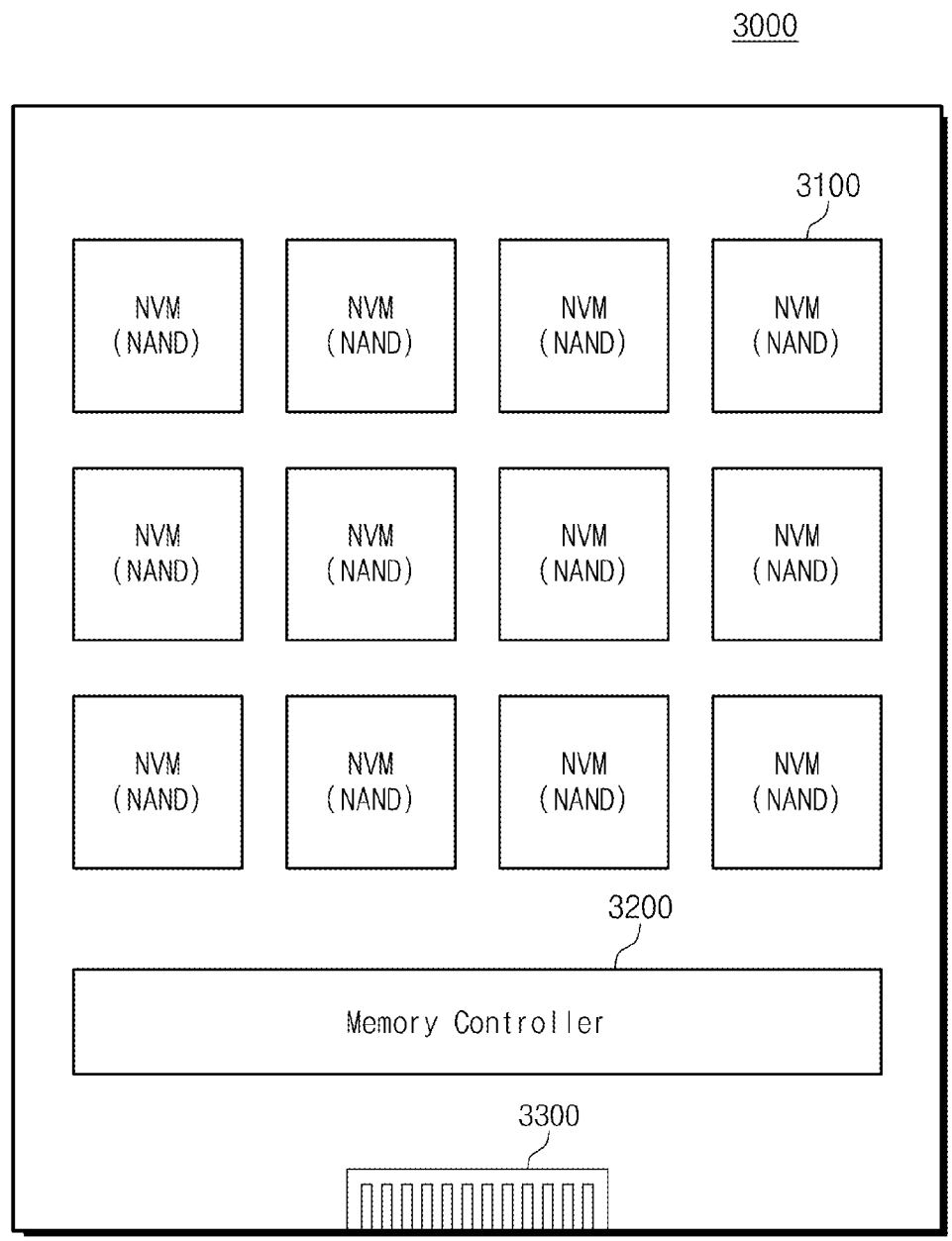
FIG. 18 illustrates a solid state drive in accordance with an embodiment of the inventive concept.

FIG. 18 illustrates a solid state drive in accordance with an embodiment of the inventive concept. Referring to FIG. 18, a solid state drive 3000 includes a plurality of nonvolatile memories 3100, a memory controller 3200 and a connector 3300. Each of the nonvolatile memories 3100 or the memory controller 3200 can perform a reset according to some embodiments of the inventive concept. The connector 3300 can electrically connect the solid state drive 3000 to an external device (for example, a host).

A nonvolatile memory device in accordance with an embodiment of the inventive concept can erase data of an erase-requested sub-block among a plurality of sub-blocks and prevent data of a sub-block which is not erase-requested from being erased.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents. Therefore, the above-disclosed subject matter is to be considered illustrative, and not restrictive.

What is claimed is:

1. A method of operating a storage device having a nonvolatile memory including at least one memory block having a plurality of sub-blocks each including a plurality of memory cells, the method comprising:
    reading backup data of memory cells having a highest program state among the plurality of memory cells connected to at least one word line of a first sub-block, wherein the first sub-block is not erase-requested, adjacent to second sub-block, wherein the second sub-block is an erase-requested sub-block among the plurality of sub-blocks;
    storing the backup data;
    erasing the second sub-block; and
    reprogramming the memory cells having the highest program state among the plurality of memory cells connected to the at least one word line of the first sub-block, on the basis of the backup data,
    wherein the storage device further comprises a memory controller generating backup read voltage information to output the backup read voltage information to the nonvolatile memory; and
    wherein the backup data of the memory cells having the highest program state among the plurality of memory cells connected to the at least one word line of the first sub-block is read in response to the backup read voltage information.

2. The method of claim 1, wherein the memory controller further generates a backup command signal; and wherein the nonvolatile memory outputs the backup data to the memory controller in response to the backup command signal.

3. The method of claim 2, wherein the memory controller stores the backup data being output from the nonvolatile memory.

4. The method of claim 1, wherein the memory controller further generates a backup program command signal and outputs the backup program command signal and the backup data to the nonvolatile memory; and wherein the nonvolatile memory reprograms the memory cells having the highest program state among the plurality of memory cells connected to the at least one word line of the first sub-block in response to the backup program command signal.

5. The method of claim 1 wherein the at least one word line of the first sub-block includes a backup word line, the method further comprising performing a normal program operation on the memory cells having the highest program state among the plurality of memory cells connected to the backup word line before erasing the second sub-block; wherein a first start voltage provided to the backup word line during the normal program operation is different from a second start voltage provided to the backup word line during the reprogramming.

6. The method of claim 5, wherein in the normal program operation, a plurality of normal program verify voltages for verifying a program state of the memory cells is provided to the backup word line; and wherein in the reprogram operation, one program verify voltage for verifying a program state of the memory cells is provided to the backup word line.

7. The method of claim 6, wherein in the reprogram operation, a program loop for performing reprogram and program verify read operations is repeatedly performed.

8. The method of claim 5, wherein a voltage condition of the reprogram operation is controlled based on the elapsed time after the normal program operation is performed.

9. A method of operating a storage device having a nonvolatile memory including at least one memory block having a plurality of sub-blocks each including a plurality of memory cells, the method comprising:
reading data of a plurality of memory cells connected to at least one word line of a first sub-block which is not erase-requested, adjacent to a second sub-block which is an erase-requested sub-block among the sub-blocks;
performing an error correction operation on the read data;
storing error-corrected data;
erasing the second sub-block; and
reprogramming data having a highest program state among stored data in the first sub-block,
wherein one or more voltage conditions which are applied to the first sub-block reprogramming the data having the highest program state among stored data in the first sub-block are controlled based on an elapsed time between a time when a normal program operation was performed for the first sub-block and a time when the reprogramming of data in the first sub-block.

10. The method of claim 9, wherein the storage device further comprises a memory controller receiving the read data; and wherein the memory controller stores the error-corrected data and after the erasing, outputs the data having the highest program state among the stored data to the nonvolatile memory.

11. The method of claim 10, wherein the memory controller comprises an error correction circuit performing an error correction on the read data and a random access memory (RAM) storing the error-corrected data.

12. The method of claim 9, wherein the storage device further comprises a memory controller generating backup read voltage information to output the backup read voltage information to the nonvolatile memory; and
wherein the backup data of the memory cells having the highest program state among the plurality of memory cells connected to the at least one word line of the first sub-block adjacent to the second sub-block is read in response to the backup read voltage information generated from the memory controller.

13. A nonvolatile memory device comprising:
a memory cell array comprising at least one memory block having a plurality of sub-blocks with a plurality of memory cells connected to at least one backup word line among a plurality of word lines of a first sub-block which is not erase-requested adjacent to a second sub-block which is an erase-requested sub-block among the sub-blocks;
a page buffer circuit coupled to the memory cell array and configured to store backup data of memory cells having a highest program state among the memory cells connected to the backup word line; and
control logic configured to control a normal program operation on the memory cells having the highest program state among the memory cells connected to the backup word line before an erase of the second sub-block is performed, and to further control a reprogramming of the memory cells having the highest program state among the memory cells connected to the backup word line after the erase of the second sub-block is performed;
wherein after the erase of the second sub-block is performed, the control logic reprograms the backup data in the memory cells having the highest program state among the memory cells connected to the backup word line, and
wherein a first start voltage provided to the backup word line for the normal program operation is different from a second start voltage provided to the backup word line for reprogramming the backup data in the memory cells having the highest program state among the memory cells connected to the backup word line.

14. The nonvolatile memory device of claim 13, wherein the control logic comprises a voltage generating unit; and wherein the voltage generating unit applies a word line erase voltage to the backup word line to perform the erase of the second sub-block, while word lines of the first sub-block are floated.

15. The nonvolatile memory device of claim 13, wherein the control logic is configured to, in the reprogram operation, provide one program verify voltage for verifying a program state of the backup memory cells to the backup word line.

16. The nonvolatile memory device of claim 13, wherein a first start voltage provided to the backup word line during the normal program operation is less than a second start voltage provided to the backup word line during the reprogramming.

17. The nonvolatile memory device of claim 13, wherein the memory block comprises a plurality of cell strings being arranged along rows and columns on a substrate and each cell string comprises at least one ground select transistor, the plurality of memory cells and at least one string select transistor being sequentially stacked on the substrate in a direction perpendicular to the substrate.

18. The nonvolatile memory device of claim 17, wherein the memory cells of the each cell string are divided into the sub-blocks.

19. The nonvolatile memory device of claim 13, wherein one or more voltage conditions which are applied to the first sub-block while reprogramming the data having the highest program state among stored data in the first sub-block are controlled based on an elapsed time between a time when a normal program operation was performed for the first sub-block and a time when the reprogramming is performed.

* * * * *